United States Patent
Hatakeyama et al.

(10) Patent No.: US 9,082,614 B1
(45) Date of Patent: Jul. 14, 2015

(54) PERIPHERY COATING APPARATUS, PERIPHERY COATING METHOD AND STORAGE MEDIUM THEREFOR

(71) Applicant: Tokyo Electron Limited, Tokyo (JP)

(72) Inventors: Shinichi Hatakeyama, Koshi (JP); Yoshitomo Sato, Koshi (JP); Kazuyuki Tashiro, Koshi (JP); Naofumi Kishita, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/682,268

(22) Filed: Apr. 9, 2015

Related U.S. Application Data

(62) Division of application No. 14/095,054, filed on Dec. 3, 2013, now Pat. No. 9,027,508.

(30) Foreign Application Priority Data

Dec. 4, 2012 (JP) ................................. 2012-265395

(51) Int. Cl.
  *H01L 21/31* (2006.01)
  *H01L 21/02* (2006.01)
(52) U.S. Cl.
  CPC ................................. *H01L 21/02282* (2013.01)
(58) Field of Classification Search
  CPC ................................. H01L 21/02; H01L 21/67
  USPC ........................................ 438/778; 118/695
  See application file for complete search history.

(56) References Cited

U.S. PATENT DOCUMENTS

| | | | | |
|---|---|---|---|---|
| 5,923,915 A | * | 7/1999 | Akimoto et al. | 396/604 |
| 6,524,388 B1 | * | 2/2003 | Yamada et al. | 118/663 |
| 9,027,508 B2 | * | 5/2015 | Hatakeyama et al. | 118/695 |
| 2004/0115956 A1 | * | 6/2004 | Ishida | 438/782 |
| 2006/0033678 A1 | * | 2/2006 | Lubomirsky et al. | 345/32 |
| 2006/0088791 A1 | * | 4/2006 | Harumoto et al. | 430/325 |
| 2006/0098977 A1 | * | 5/2006 | Kaneyama | 396/611 |
| 2006/0098979 A1 | * | 5/2006 | Kaneyama et al. | 396/611 |
| 2006/0104635 A1 | * | 5/2006 | Kaneyama et al. | 396/611 |
| 2006/0120716 A1 | * | 6/2006 | Hamada | 396/611 |
| 2006/0147201 A1 | * | 7/2006 | Asano et al. | 396/611 |
| 2006/0147202 A1 | * | 7/2006 | Yasuda et al. | 396/611 |
| 2006/0152694 A1 | * | 7/2006 | Yasuda et al. | 355/27 |
| 2006/0165409 A1 | * | 7/2006 | Akimoto et al. | 396/611 |
| 2006/0291855 A1 | * | 12/2006 | Shigemori et al. | 396/611 |

(Continued)

FOREIGN PATENT DOCUMENTS

JP 2009-295637 A 12/2009

*Primary Examiner* — Caleb Henry
(74) *Attorney, Agent, or Firm* — Pearne & Gordon LLP

(57) ABSTRACT

There is provided a periphery coating method of coating a coating liquid on a periphery region of a substrate. The method includes performing a scan-in process of moving the coating liquid nozzle from an outside of an edge of the substrate to a position above the periphery region of the substrate while rotating the substrate and discharging the coating liquid from the coating liquid nozzle; and performing a scan-out process of moving the coating liquid nozzle from the position above the periphery region of the substrate to the outside of the edge of the substrate while rotating the substrate and discharging the coating liquid from the coating liquid nozzle. Further, in the scan-out process, the coating liquid nozzle is moved at a speed lower than a speed at which the coating liquid is moved to a side of an edge of the substrate.

3 Claims, 16 Drawing Sheets

(56) References Cited

U.S. PATENT DOCUMENTS

| | | | |
|---|---|---|---|
| 2007/0065145 A1* | 3/2007 | Kitamura | 396/611 |
| 2007/0111519 A1* | 5/2007 | Lubomirsky et al. | 438/678 |
| 2007/0147831 A1* | 6/2007 | Kaneyama et al. | 396/611 |
| 2007/0147832 A1* | 6/2007 | Shigemori et al. | 396/611 |
| 2007/0166031 A1* | 7/2007 | Hamada | 396/611 |
| 2007/0172233 A1* | 7/2007 | Hamada | 396/611 |
| 2007/0172234 A1* | 7/2007 | Shigemori et al. | 396/611 |
| 2007/0183775 A1* | 8/2007 | Mitsuhashi et al. | 396/611 |
| 2008/0267619 A1* | 10/2008 | Matsuoka | 396/611 |
| 2009/0067959 A1* | 3/2009 | Takahashi et al. | 414/226.01 |
| 2009/0074402 A1* | 3/2009 | Miyagi et al. | 396/611 |
| 2009/0311632 A1* | 12/2009 | Takeguchi et al. | 430/322 |
| 2010/0192517 A1* | 8/2010 | Schach | 53/411 |
| 2010/0232781 A1* | 9/2010 | Hontake et al. | 396/611 |
| 2011/0236011 A1* | 9/2011 | Kaneyama | 396/611 |
| 2011/0286738 A1* | 11/2011 | Noda et al. | 396/611 |
| 2012/0008936 A1* | 1/2012 | Matsuoka et al. | 396/611 |
| 2012/0014689 A1* | 1/2012 | Ookouchi et al. | 396/611 |
| 2012/0057861 A1* | 3/2012 | Matsuoka et al. | 396/611 |
| 2012/0063765 A1* | 3/2012 | Hayashi et al. | 396/611 |
| 2012/0125483 A1* | 5/2012 | Brelivet | 141/369 |
| 2012/0229822 A1* | 9/2012 | Shimoda et al. | 358/1.6 |
| 2014/0154890 A1* | 6/2014 | Hatakeyama et al. | 438/778 |
| 2014/0179121 A1* | 6/2014 | Ikegawa et al. | 438/782 |
| 2014/0261569 A1* | 9/2014 | Fonseca et al. | 134/30 |
| 2014/0261570 A1* | 9/2014 | Orii et al. | 134/31 |
| 2014/0283887 A1* | 9/2014 | Tanaka et al. | 134/58 R |
| 2014/0295677 A1* | 10/2014 | Shimizu et al. | 438/778 |

* cited by examiner

PERIPHERY COATING APPARATUS, PERIPHERY COATING METHOD AND STORAGE MEDIUM THEREFOR

CROSS-REFERENCE TO RELATED APPLICATION

This is a divisional application of U.S. patent application Ser. No. 14/095,054, filed on Dec. 3, 2013 which claims the benefit of Japanese Patent Application No. 2012-265395 filed on Dec. 4, 2012, the entire disclosures of which are incorporated herein by reference.

TECHNICAL FIELD

The embodiments described herein pertain generally to a periphery coating apparatus, a periphery coating method and a storage medium for coating a coating liquid on a periphery region of a substrate.

BACKGROUND

Conventionally, there is known a method of forming a resist film only on a periphery region of a semiconductor wafer (hereinafter, simply referred to as a "wafer") in a semiconductor manufacturing process (see, for example Patent Document 1). Patent Document 1 describes a processing method of forming a silicide layer at a central portion of a wafer. Also described is a method of coating a periphery region of the wafer with a resist film in order to suppress the silicide layer from being formed on the periphery region of the wafer when forming the silicide layer. In the method described in Patent Document 1, a resist film is formed by coating and drying a negative type resist liquid on an entire surface of the wafer. Then, an exposure process is performed on the resist film on the periphery region of the wafer, and then, a developing process is performed. Through the developing process, the resist film on the central portion of the wafer is dissolved, and an annular resist film is formed on the wafer.

Patent Document 1: Japanese Patent Laid-open Publication No. 2009-295637

Since the aforementioned method of forming the resist film involves many processes such as the coating process, the drying process, the exposure process and developing process of a resist liquid, etc., a throughput of the semiconductor manufacturing process may be deteriorated. To solve the problem, it may be considered to coat a positive type resist liquid only on the periphery region of the wafer while rotating the wafer. With this method, an annular resist film can be formed just by coating and drying the resist liquid. However, a thickness of the resist film may become non-uniform by being affected by a centrifugal force generated when the wafer is rotated. The resist film is required to have a high protective function and to be easily removable after used. To meet such conflicted requirements, a tolerance range of the thickness of the resist film is narrow. In this regard, if the thickness of the resist film becomes non-uniform, there is a concern that the thickness of the resist film may not fall within the tolerance range.

SUMMARY

In view of the foregoing, example embodiments provide a periphery coating apparatus, a periphery coating method and a storage medium for efficiently forming a coating film having a sufficiently uniform thickness only on a periphery region of a substrate.

In one example embodiment, a periphery coating apparatus that coats a coating liquid on a periphery region of a substrate includes a rotatable holding unit configured to hold and rotate the substrate thereon horizontally; a coating liquid supply unit provided above the substrate, having a coating liquid nozzle that discharges a coating liquid downward, and configured to supply the coating liquid onto a surface of the substrate; a horizontal transfer unit configured to move the coating liquid nozzle in a horizontal direction; and a coating controller configured to control the rotatable holding unit, the coating liquid supply unit and the horizontal transfer unit. The coating controller performs a scan-in process of moving the coating liquid nozzle from an outside of an edge of the substrate to a position above the periphery region of the substrate by controlling the horizontal transfer unit while rotating the substrate by controlling the rotatable holding unit and discharging the coating liquid from the coating liquid nozzle by controlling the coating liquid supply unit, and a scan-out process of moving the coating liquid nozzle from the position above the periphery region of the substrate to the outside of the edge of the substrate by controlling the horizontal transfer unit while rotating the substrate by controlling the rotatable holding unit and discharging the coating liquid from the coating liquid nozzle by controlling the coating liquid supply unit. When performing the scan-out process, the coating liquid nozzle is moved at a speed lower than a speed at which the coating liquid is moved to a side of the edge of the substrate.

In this periphery coating apparatus, if the coating controller performs the scan-in process, the coating liquid nozzle is moved from the outside of the edge of the substrate to a position above the periphery region of the substrate while rotating the substrate and discharging the coating liquid from the coating liquid nozzle. As the substrate is rotated, an entire periphery region of the substrate is allowed to pass below the coating liquid nozzle. Accordingly, the coating liquid is coated on the entire periphery region of the substrate, so that an annular coating film is formed. If the coating controller performs the scan-out process, the coating liquid nozzle is moved from the position above the periphery region of the substrate to the outside of the edge of the substrate, and the coating of the coating liquid is finished. Accordingly, the coating film can be formed only on the periphery region of the substrate efficiently. Here, a surplus coating liquid coated on the periphery region of the substrate is moved to the side of the edge of the substrate by a centrifugal force generated by the rotation of the substrate. In the scan-out process, the coating liquid nozzle is moved at a speed lower than a speed at which the coating liquid is moved to the side of the edge of the substrate. Accordingly, the surplus coating liquid may be pushed by the coating liquid discharged from the coating liquid nozzle toward the outside of the edge of the substrate. Further, the coating liquid nozzle is moved at a lower speed and thus allowed to stay above the periphery region of the substrate for a long time. Accordingly, even when the surplus coating liquid starts to be hardened on the periphery region of the substrate, the surplus coating liquid starting to be hardened may be dissolved by the coating liquid discharged from the coating liquid nozzle and pushed toward the outside of the edge of the substrate. Therefore, it is possible to suppress the surplus coating liquid from being concentrated on the side of the edge of the substrate. Thus, a coating film having a sufficiently uniform thickness can be formed.

When performing the scan-out process, the coating controller may move the coating liquid nozzle at a speed lower than a speed at which the coating liquid nozzle is moved in the scan-in process. Further, when performing the scan-out process, the coating controller may move the coating liquid nozzle at a speed equal to or less than about 0.004% of a value obtained by multiplying a radius of the substrate by the square of a rotational speed per second. Furthermore, when performing the scan-out process, the coating controller may move the coating liquid nozzle at a speed equal to or less than about 4 mm/s. In these cases, the surplus coating liquid can be pushed toward the outside of the periphery of the substrate more securely.

When performing the scan-out process, the coating controller may rotate the substrate at a rotational speed higher than a rotational speed in the scan-in process. In this case, in the scan-out process, the moving speed of the surplus coating liquid toward the side of the edge of the substrate can be increased. Accordingly, by setting the moving speed of the coating liquid nozzle to be relatively lower than the moving speed of the surplus coating liquid toward the side of the edge of the substrate, the surplus coating liquid can be pushed to the outside of the edge of the substrate more securely.

Viscosity of the coating liquid may be in the range from about 3 cP to about 100 cP. Further, an inner diameter of the coating liquid nozzle may be in the range from about 0.4 mm to about 0.8 mm. In these cases, the surplus coating liquid can be pushed to the outside of the edge of the substrate more securely.

A discharge direction in which the coating liquid nozzle discharges the coating liquid from the position above the periphery region of the substrate may be inclined toward an opposite side to a rotation center of the substrate. Further, the discharge direction in which the coating liquid nozzle discharges the coating liquid from the position above the periphery region of the substrate may be inclined at an inclination angle ranging from about 15° to about 90° with respect to a horizontal plane. In these cases, the surplus coating liquid can be pushed to the outside of the edge of the substrate more securely.

The periphery coating apparatus may further include a gas discharging unit, having a gas nozzle, configured to discharge a gas onto the surface of the substrate, the gas nozzle being positioned closer to the rotation center of the substrate than the coating liquid nozzle and configured to discharge the gas downward. Further, the horizontal transfer unit may move the gas nozzle together with the coating liquid nozzle in the horizontal direction, and when performing the scan-out process, the coating controller may control the gas discharging unit to discharge the gas from the gas nozzle. In this case, the gas may be discharged to a portion of the substrate closer to the rotation center than a portion of the substrate where the coating liquid discharged from the coating liquid nozzle arrives. Accordingly, it may be possible to accelerate the hardening of the portion of the substrate from which the surplus coating liquid is removed as the coating liquid nozzle passes over. Hence, the uniformity of the film thickness obtained by the operation of the coating liquid nozzle can be maintained more securely.

When performing the scan-out process, the coating controller may control the coating liquid supply unit such that a discharging pressure of the coating liquid increases as the coating liquid nozzle approaches the side of the edge of the substrate. The surplus coating liquid tends to be concentrated on the side of the edge of the substrate due to the centrifugal force generated by the rotation of the substrate. Thus, by increasing the discharging pressure of the coating liquid as the coating liquid nozzle approaches the edge of the substrate, the surplus coating liquid can be further securely pushed toward the outside of the edge of the substrate.

When performing the scan-out process, the coating controller may control the horizontal transfer unit such that a moving speed of the coating liquid nozzle decreases as the coating liquid nozzle approaches the side of the edge of the substrate. In this case, by decreasing the moving speed of the coating liquid nozzle as the coating liquid nozzle approaches the edge of the substrate, the time during which the coating liquid nozzle stays above the periphery region of the substrate can be lengthened. Accordingly, the surplus coating liquid can be pushed toward the outside of the edge of the substrate more securely.

In another example embodiment, a periphery coating method of coating a coating liquid on a periphery region of a substrate includes performing a scan-in process of moving the coating liquid nozzle from an outside of an edge of the substrate to a position above the periphery region of the substrate while rotating the substrate and discharging the coating liquid from the coating liquid nozzle; and performing a scan-out process of moving the coating liquid nozzle from the position above the periphery region of the substrate to the outside of the edge of the substrate while rotating the substrate and discharging the coating liquid from the coating liquid nozzle. Further, in the scan-out process, the coating liquid nozzle is moved at a speed lower than a speed at which the coating liquid is moved to a side of an edge of the substrate.

In this periphery coating method, in performing the scan-in process, the coating liquid nozzle is moved from the outside of the edge of the substrate to a position above the periphery region of the substrate while rotating the substrate and discharging the coating liquid from the coating liquid nozzle. As the substrate is rotated, an entire periphery region of the substrate is allowed to pass below the coating liquid nozzle. Accordingly, the coating liquid is coated on the entire periphery region of the substrate, so that an annular coating film is formed. In performing the scan-out process, the coating liquid nozzle is moved from the position above the periphery region of the substrate to the outside of the edge of the substrate, and the coating of the coating liquid is finished. Accordingly, the coating film can be formed only on the periphery region of the substrate efficiently. Here, the surplus coating liquid coated on the periphery region of the substrate is moved to the side of the edge of the substrate by a centrifugal force generated by the rotation of the substrate. In the scan-out process, the coating liquid nozzle is moved at a speed lower than a speed at which the coating liquid is moved to the side of the edge of the substrate. Accordingly, the surplus coating liquid may be pushed by the coating liquid discharged from the coating liquid nozzle toward the outside of the edge of the substrate. Further, the coating liquid nozzle is moved at a lower speed and thus allowed to stay above the periphery region of the substrate for a long time. Accordingly, even when the surplus coating liquid starts to be hardened on the periphery region of the substrate, the surplus coating liquid starting to be hardened may be dissolved by the coating liquid discharged from the coating liquid nozzle and pushed toward the outside of the edge of the substrate. Therefore, it is possible to suppress the surplus coating liquid from being concentrated on the side of the edge of the substrate. Thus, a coating film having a sufficiently uniform thickness can be formed.

In the scan-out process, the coating liquid nozzle may be moved at a speed lower than a speed at which the coating liquid nozzle is moved in the scan-in process. In this case, the surplus coating liquid can be pushed toward the outside of the edge of the substrate more securely.

In still another example embodiment, a computer-readable storage medium has stored thereon computer-executable instructions, in response to execution, cause a periphery coating apparatus to perform a periphery coating method described above.

By using the periphery coating apparatus, the periphery coating method and the storage medium therefor in accordance with the example embodiments, it may be possible to form a coating film having a sufficiently uniform thickness only on a periphery region of a substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
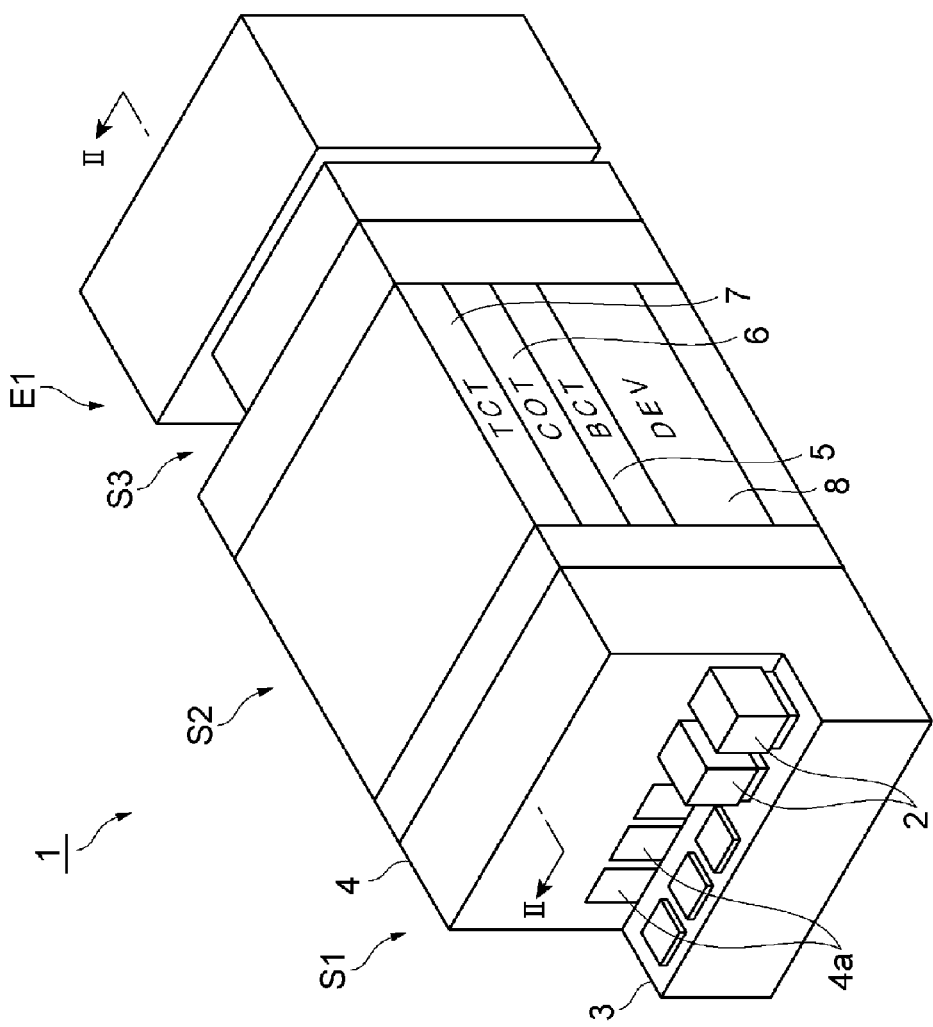
FIG. 1 is a perspective view of a coating/developing apparatus to which a periphery coating apparatus in accordance with an example embodiment is applied.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 2:
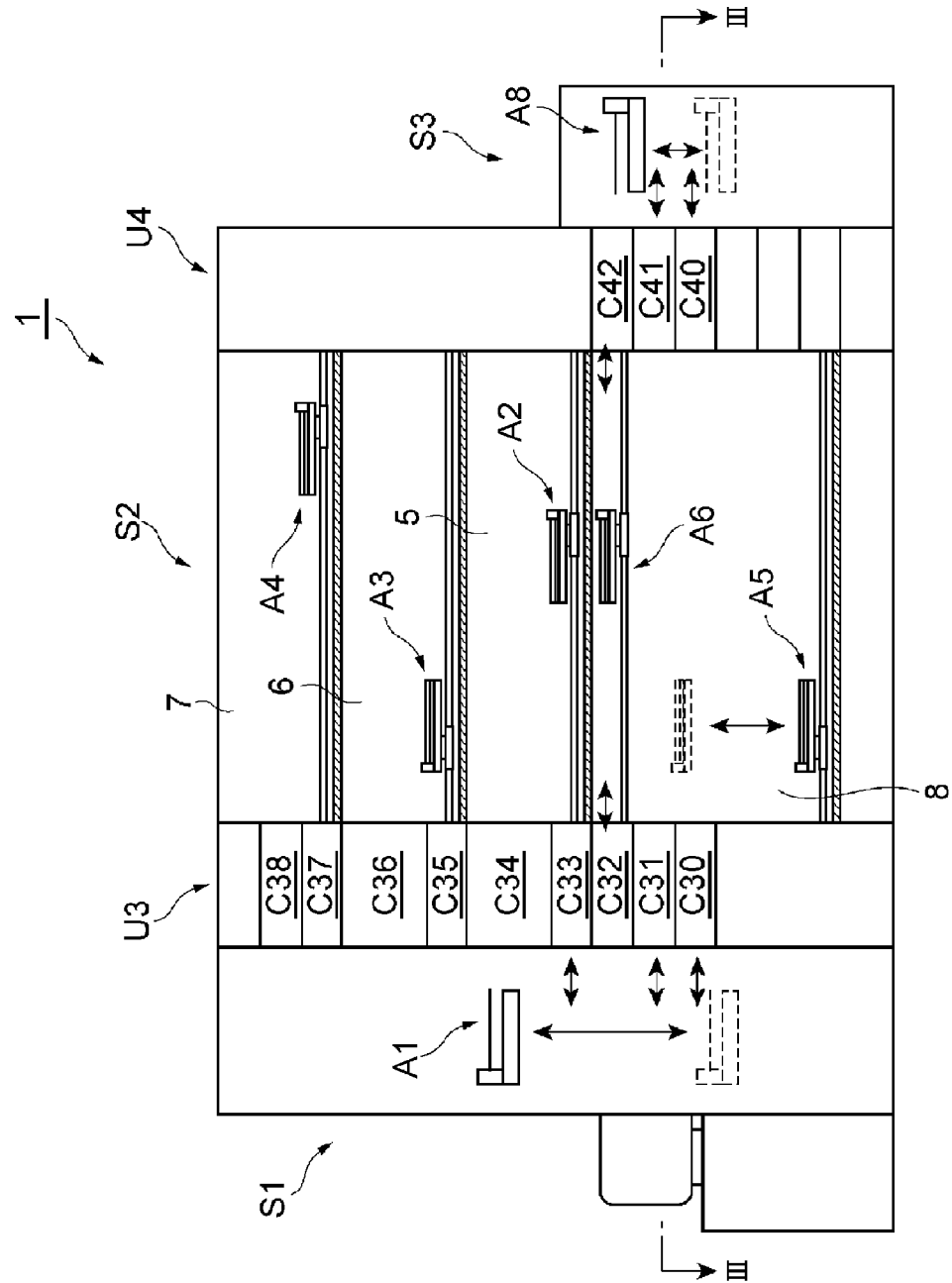
FIG. 2 is a cross sectional view taken along a line II-II of FIG. 1.
Figure 3:
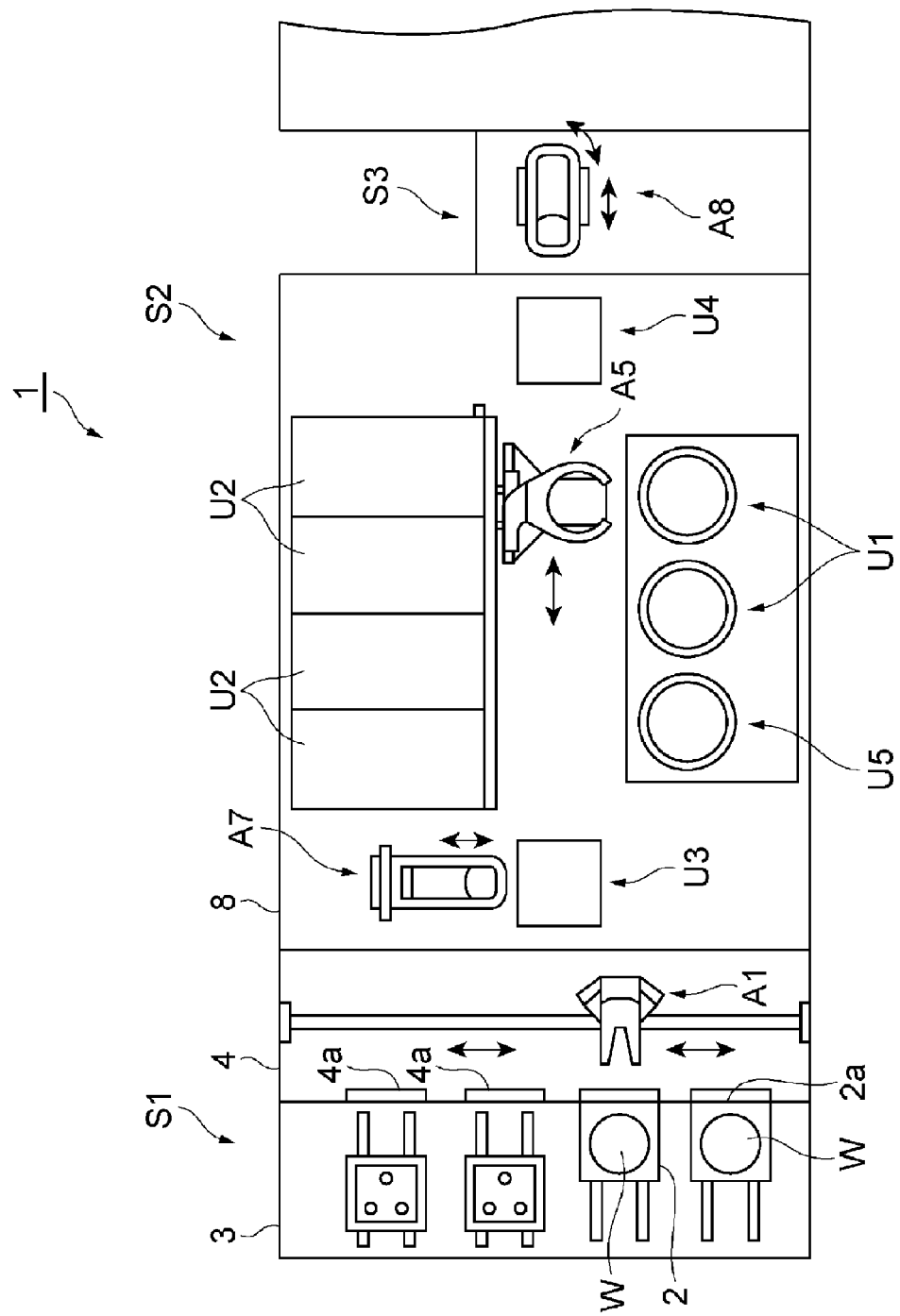
FIG. 3 is a cross sectional view taken along a line III-III of FIG. 2.

A periphery coating apparatus in accordance with an example embodiment is configured to coat a resist liquid on a periphery region of a wafer in a coating/developing apparatus for a semiconductor wafer (hereinafter, simply referred to as a "wafer"). Here, an example coating/developing apparatus to which the periphery coating apparatus of the example embodiment is applied will be explained first. As depicted in FIG. 1 to FIG. 3, the coating/developing apparatus includes a carrier block S1, a processing block S2 adjacent to the carrier block S1, and an interface block S3 adjacent to the processing block S2. In the following description, the directions of front, rear, left and right are defined with the interface block S3 at the front and the carrier block S1 at the rear.

The carrier block S1 includes a carrier station 3 for mounting thereon a multiple number of carriers 2; and a loading/unloading unit 4 provided between the carrier station 3 and the processing block S2. Each carrier 2 is configured to hermetically accommodate therein a multiple number of wafers (substrates) W and is detachably mounted on the carrier station 3. On one side 2a of the carrier 2, an opening/closing door (not shown) through which the wafers W are loaded and unloaded is provided. The loading/unloading unit 4 is provided with opening/closing doors 4a corresponding to the multiple number of carriers 2 mounted on the carrier station 3, respectively. Accommodated in the loading/unloading unit 4 is a delivery arm A1 configured to take out the wafer W from the carrier 2 on the carrier station 3, transfer the wafer W to the processing block S2, receive the wafer W from the processing block S2 and return the wafer W back into the carrier 2.

The processing block S2 includes a bottom anti-reflection film forming (BCT) block 5 configured to form a bottom anti-reflection film on a surface of the wafer W; a resist film forming (COT) block 6 configured to form a resist film on the bottom anti-reflection film; a top anti-reflection film forming (TCT) block 7 configured to form a top anti-reflection film on the resist film; and a developing (DEV) block 8 configured to perform a developing process. These blocks are stacked on top of each other in the order of the DEV block 8, the BCT block 5, the COT block 6 and the TCT block 7 from the bottom.

The BCT block 5 includes a non-illustrated coating unit for coating a chemical liquid for forming an anti-reflection film; a non-illustrated heating/cooling unit; and a transfer arm A2 configured to transfer a wafer W into these units. Likewise, the TCT block 7 also includes a coating unit, a heating/cooling unit and a transfer arm A4. The COT block 6 includes a non-illustrated coating unit for coating a chemical liquid for forming a resist film; a non-illustrated heating/cooling unit; and a transfer arm A3 configured to transfer a wafer W into these units.

As shown in FIG. 2 and FIG. 3, the DEV block 8 includes a multiple number of developing units U1, a multiplicity of periphery coating units (periphery coating apparatuses) U5, a multiple number of heating/cooling units U2, a transfer arm A5 configured to transfer a wafer W into these units, and a direct transfer arm A6 configured to transfer a wafer W between the front side and the rear side of the processing block S2 without passing through these units. Each periphery coating unit U5 is configured to coat a resist liquid on a periphery region of a wafer W on which a developing process has been performed by any one developing unit U1. The multiple number of developing units U1 and the multiplicity of periphery coating units U5 are arranged in a forward/backward direction at a right side of the DEV block 8, and are vertically stacked in two levels. The multiple number of heating/cooling units U2 are arranged in the forward/backward direction at a left side of the DEV block 8. The transfer arm A5 is provided between the developing units U1 and the heating/cooling units U2. The transfer arm A5 is configured to be movable in the forward/backward direction and in a vertical direction. The direct transfer arm A6 is provided at an upper portion of the DEV block 8, and is configured to be movable in the forward/backward direction.

A shelf unit U3 is disposed at the rear side of the processing block S2 to be extended from a bottom surface thereof up to the TCT block 7. The shelf unit U3 is partitioned into a multiple number of cells C30 to C38 that are arranged in the vertical direction. An elevating arm A7 configured to be movable up and down is provided at a vicinity of the shelf unit U3 to transfer wafers W between the cells C30 to C38. Further, a shelf unit U4 is provided at the front side of the processing block S2 to be extended from the bottom surface thereof to a top portion of the DEV block 8. The shelf unit U4 is partitioned into a multiple number of cells C40 to C42 that are arranged in the vertical direction.

The interface block S3 is connected to an exposure apparatus E1. Accommodated in the interface block S3 is a delivery arm A8 configured to deliver a wafer W from the shelf unit U4 of the processing block S2 to the exposure apparatus E1, and returns the wafer W received from the exposure apparatus E1 back into the shelf unit U4.

In the coating/developing apparatus 1 having the above-described configuration, a carrier 2 accommodating a multiple number of wafers W therein is mounted on the carrier station 3. At this time, the one side 2a of the carrier 2 faces the opening/closing door 4a of the loading/unloading unit 4. Then, the opening/closing door of the carrier 2 and the opening/closing door 4a of the loading/unloading unit 4 are opened, and each of the wafers W is taken out of the carrier 2 by the delivery arm A1, and then, transferred into one of the cells in the shelf unit U3 of the processing block S2 in sequence.

Each of the wafers W transferred into one of the cells by the delivery arm A1 is transferred in sequence into the cell C33 corresponding to the BCT block 5. Each wafer W transferred into the cell C33 is then delivered into respective units within the BCT block 5 by the transfer arm A2, so that a bottom anti-reflection film is formed on a surface of the wafer W.

The wafer W on which the bottom anti-reflection film is formed is transferred into the cell C34 on the cell C33 by the transfer arm A2. Then, the wafer W is transferred from the cell C34 into the cell C35 corresponding to the COT block 6 by the elevating arm A7. Thereafter, the wafer W in the cell C35 is transferred into respective units within the COT block 6, so that a resist film is formed on the bottom anti-reflection film.

The wafer W on which the resist film is formed is transferred into the cell C36 on the cell C35 by the transfer arm A3. Thereafter, the wafer W is transferred from the cell C36 into the cell C37 corresponding to the TCT block 7 by the elevating arm A7. The wafer W in the cell C37 is then transferred into respective units within the TCT block 7, so that a top anti-reflection film is formed on the resist film of the wafer W.

The wafer W on which the top anti-reflection film is formed is transferred into the cell C38 on the cell C37 by the transfer arm A4. The wafer W is then transferred from the cell C38 into the cell C32 corresponding to the direct transfer arm A6 and moved into the cell C42 of the shelf unit U4 by the direct transfer arm A6. Then, the wafer W is delivered from the cell C42 into the exposure apparatus E1 by the delivery arm A8 of the interface block S3, and an exposure process of the resist film is performed therein. After the exposure process, the wafer W is delivered by the delivery arm A8 into the cell C40 or C41 under the cell C42.

The wafer W delivered into the cell C40 or C41 is then transferred by the transfer arm A5 into respective units within the DEV blocks 8, so that a developing process is performed and a resist pattern is formed on the surface of the wafer W. The wafer W on which the resist pattern is formed is then transferred into the periphery coating unit U5 by the transfer arm A5, and a resist liquid is coated on a periphery region of the surface of the wafer W. Then, the wafer W of which periphery region is coated with the resist liquid in the periphery coating unit U5 is transferred into the heating/cooling unit U2 by the transfer arm A5 to be heated and cooled therein. As a result, a resist film (hereinafter, referred to as a "periphery resist film") is formed on the periphery region of the wafer W. Afterward, the wafer W on which the periphery resist film is formed is transferred by the transfer arm A5 into the cell C30 or C31 of the shelf unit U3 corresponding to the DEV block 8. The wafer W moved into the cell C30 or C31 is then transferred by the elevating arm A7 into a cell accessible by the delivery arm A1 and returned back into the carrier 2 by the delivery arm A1.

The above-described configuration of the coating/developing apparatus 1 is nothing more than an example. As long as the coating/developing apparatus includes a liquid processing unit such as a coating unit, a developing unit and a periphery coating unit, and a pre-treatment/post-treatment unit such as a heating/cooling unit, the number, the kind and the layout of these units can be modified appropriately.

Figure 4:
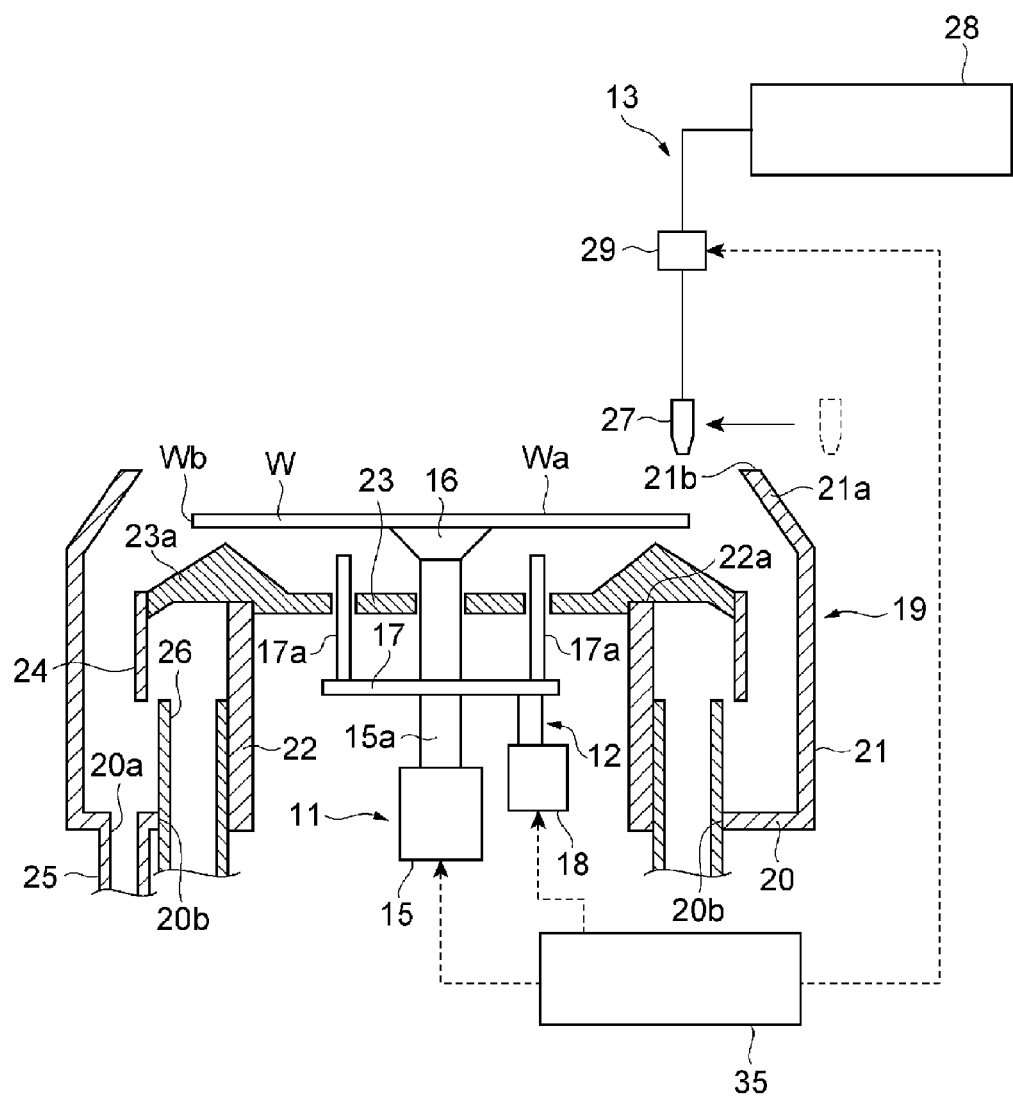
FIG. 4 is a cross sectional view illustrating a schematic configuration of a periphery coating unit.
Figure 5:
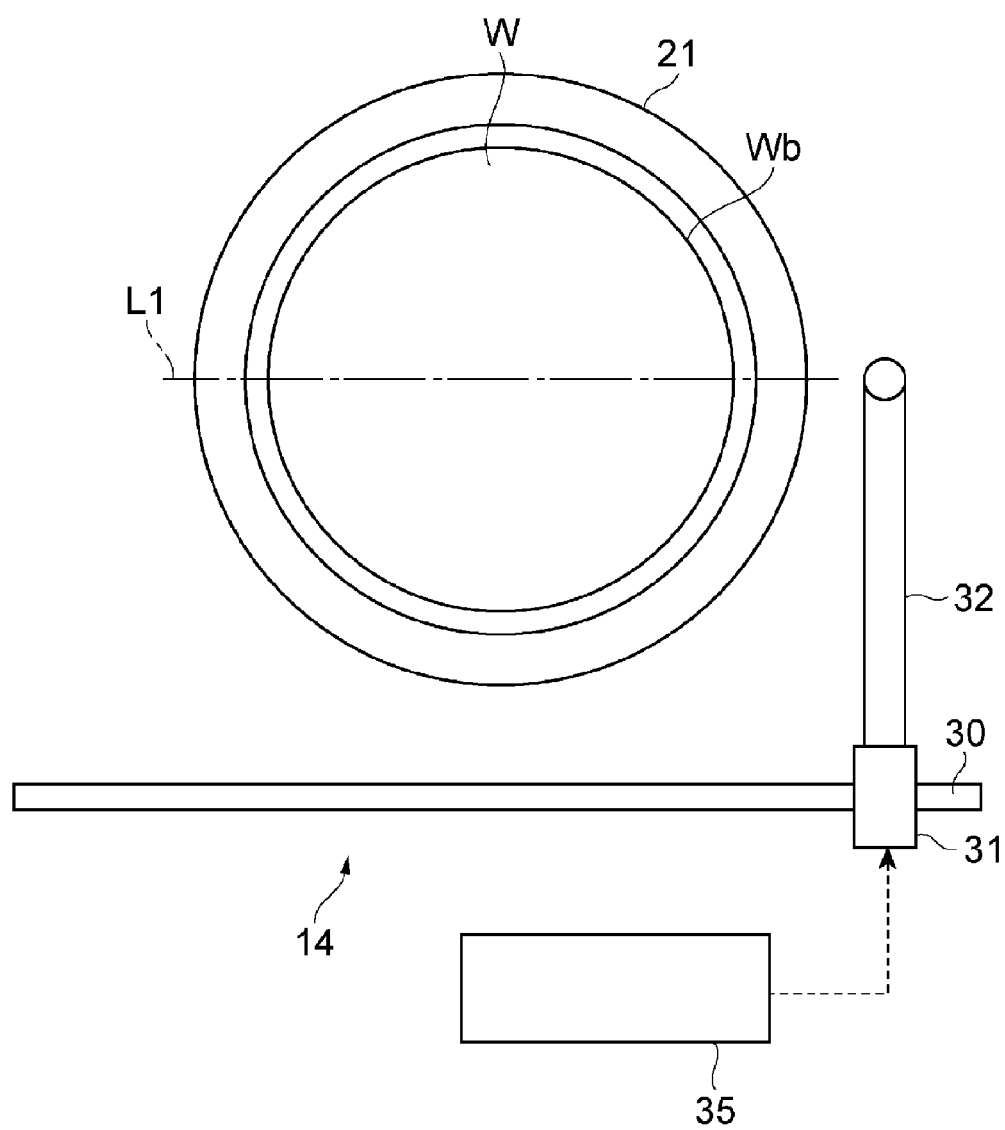
FIG. 5 is a plane view illustrating a schematic configuration of the periphery coating unit.

Now, the periphery coating unit (periphery coating apparatus) U5 will be explained in further detail. As shown in FIG. 4 and FIG. 5, the periphery coating unit U5 includes a rotatable holding unit 11 configured to hold and rotate a wafer W horizontally; an elevating unit 12 configured to move the wafer W up and down; a resist liquid supply unit (coating liquid supply unit) 13 configured to supply a resist liquid from a resist liquid nozzle (coating liquid nozzle) 27; a horizontal transfer unit 14 configured to move the resist liquid nozzle 27 in a horizontal direction; and a controller 35.

The rotatable holding unit 11 includes a rotating unit 15 and a chuck 16. The rotating unit 15 has an upwardly protruding rotation shaft 15a, and the rotation shaft 15a is rotated by a non-illustrated driving unit such as an electric motor. The chuck 16 is configured to support a central portion of the wafer W, which is horizontally placed thereon, with a surface Wa of the wafer W facing upward, and is configured to firmly hold the wafer W by the vacuum attraction or the like.

The elevating unit 12 includes a circular ring-shaped elevating disk 17 horizontally disposed to surround the rotation shaft 15a; a multiple number of elevating pins 17a protruded upward from a periphery of the elevating disk 17; and an elevating cylinder 18 configured to move the elevating disk 17 up and down. The multiple number of elevating pins 17a are arranged to surround the rotation shaft 15a. The elevating unit 12 is configured to move up the elevating pins 17a to receive a wafer W from the transfer arm A5 on leading ends of the elevating pins 17a and configured to move down the elevating pins 17a to mount the received wafer W on the chuck 16. Further, the elevating unit 12 is configured to move up the elevating pins 17a to lift up the wafer W from the chuck 16 on the leading ends of the elevating pins 17a. Then, the wafer W is transferred onto the transfer arm A5.

A cup 19 as a receptacle that receives liquid dispersed out and falling down from the wafer W is provided around the rotating unit 15. The cup 19 includes a circular ring-shaped bottom plate 20 surrounding the rotating unit 15; a cylindrical outer wall 21 protruded upward along the outer circumference of the bottom plate 20; and a cylindrical inner wall 22 protruded upward along the inner circumference of the bottom plate 20. When viewed from the top, an entire portion of the outer wall 21 is located outside an edge Wb of the wafer W held on the chuck 16. Formed at an upper end portion of the outer wall 21 is an inclined wall portion 21a of which inner diameter decreases as it goes upward. An upper end 21b of the inclined outer wall 21a is located at a height position higher than the wafer W held on the chuck 16. Further, when viewed from the top, an entire portion of the inner wall 22 is located inside the edge Wb of the wafer W held on the chuck 16. An upper end 22a of the inner wall 22 is located at a height position lower than the wafer W held on the chuck 16.

An upper portion of a space surrounded by the inner wall 22 is closed by a cover plate 23. The rotation shaft 15a and the elevating pins 17a are inserted through the cover plate 23 to penetrate it. An umbrella-shaped portion 23a protruded from a side of the inner wall 22 toward a side of the outer wall 21 is formed at a periphery of the cover plate 23. Provided at an outer periphery of the umbrella-shaped portion 23a is a cylindrical partition wall 24 extended downward to partition a space between the outer wall 21 and the inner wall 22. A lower end of the partition wall 24 and the bottom plate 20 are spaced apart from each other. A liquid drain hole 20a through which liquid is drained and a gas exhaust hole 20b through which a gas is exhausted are formed in the bottom plate 20. A liquid drain pipe 25 is connected to the liquid drain hole 20a, and a gas exhaust pipe 26 is inserted through the gas exhaust hole 20b. An upper end of the gas exhaust pipe 26 is located at a vicinity of the lower end of the partition wall 24. The liquid dispersed out from the wafer W may be introduced into a space between the outer wall 21 and the partition wall 24 by being blocked and guided by the outer wall 21 and the umbrella-shaped portion 23a, and then is discharged through the liquid drain pipe 25. A gas generated from the liquid may flow into a space between the partition wall 24 and the inner wall 22 to be exhausted through the gas exhaust pipe 26.

The resist liquid supply unit 13 includes a resist liquid nozzle 27 configured to discharge a resist liquid downward; and a resist liquid supply source 28 configured to supply the resist liquid into the resist liquid nozzle 27. A valve 29 is provided between the resist liquid nozzle 27 and the resist liquid supply source 28. The viscosity of the resist liquid supplied from the resist liquid supply unit 13 may be in the range from, e.g., about 3 cP(mPa·s) to about 100 cP(mPa·s). The horizontal transfer unit 14 includes a guide rail 30 horizontally extended at the outside of the outer wall 21; a moving body 31 configured to be moved along the guide rail 30; and an arm 32 extended from the moving body 31 toward the chuck 16. The arm 32 is extended over the wafer W held on the chuck 16. The resist liquid nozzle 27 is fastened to a leading end of the arm 32 and is located above an imaginary line L1 that is in parallel to the guide rail 30 and crosses the center of the wafer W.

Figure 6:
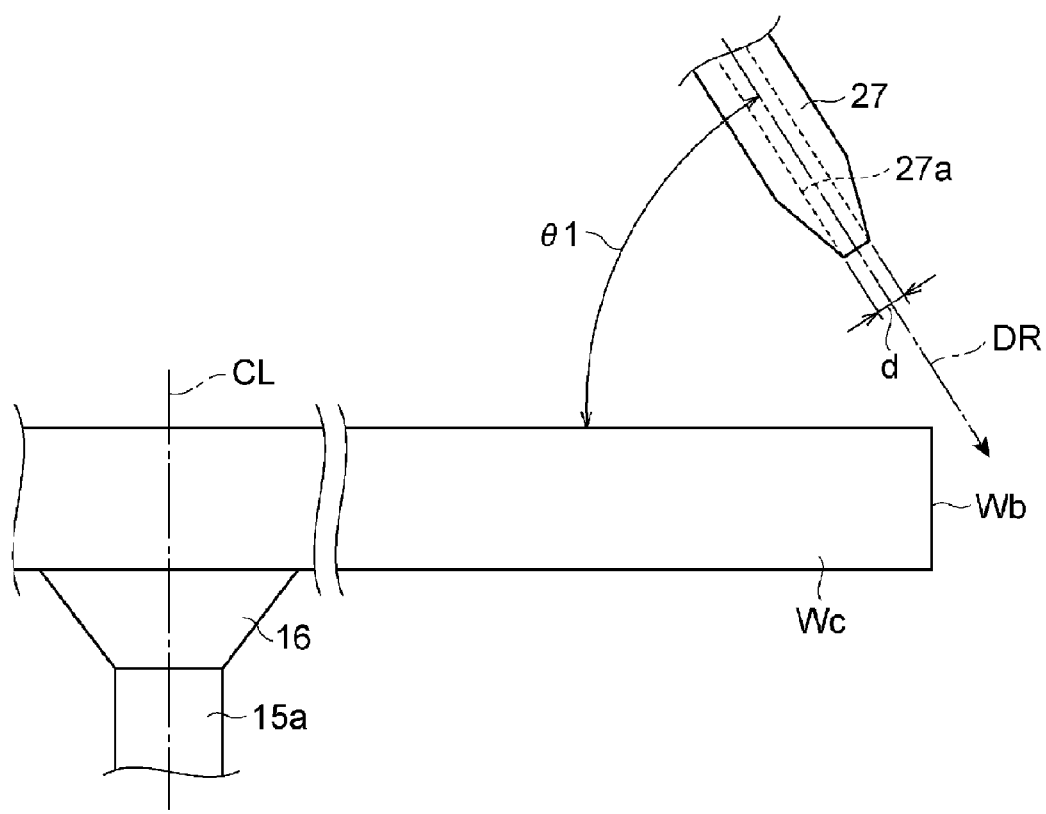
FIG. 6 is an enlarged view of a periphery region of a wafer and a coating liquid nozzle in FIG. 4.

As depicted in FIG. 6, the resist liquid nozzle 27 has a downwardly opened discharge hole 27a. The resist liquid nozzle 27 discharges the resist liquid downward along a central axis line of the discharge hole 27a. An inner diameter d of the discharge hole 27a is set to be in the range of, but not limited to, about 0.4 mm to about 0.8 mm. The central axis line of the discharge hole 27a is inclined, and a discharge direction DR, in which the resist nozzle 27 discharges the resist liquid from a position above a periphery region Wc of the wafer W, is inclined toward the opposite side to a rotation center CL of the wafer W. Desirably, an inclination angle θ1 of the discharge direction DR with respect to the horizontal plane may be in the range from, e.g., about 15° to about 90°; more desirably, about 15° to about 45°; and, most desirably, about 30° to about 45°.

The controller (coating controller) 35, which is a control computer, includes a display unit (not shown) configured to display a screen for setting resist liquid coating conditions; an input unit (not shown) through which the resist liquid coating conditions are inputted; and a reading-out unit (not shown) configured to read out a program from a computer-readable storage medium. The storage medium stores thereon a program by which the controller 35 executes a periphery coating control, and this program is read out by the reading-out unit of the controller 35. The storage medium may be implemented by, by way of example, but not limitation, a hard disk, a compact disk, a flash memory, a flexible disk, a memory card, etc. The controller 35 controls the rotatable holding unit 11, the elevating unit 12, the resist liquid supply unit 13 and the horizontal transfer unit 14 to execute a periphery coating process based on the periphery coating conditions inputted to the input unit and the program read out by the reading-out unit. Below, the sequence of operations of the periphery coating unit U5 controlled by the controller 35 will be explained.

Except for when performing a periphery coating process, the controller 35 controls the horizontal transfer unit 14 to allow the resist liquid nozzle 27 to be located at a position outside the edge Wb of the wafer W. When performing the periphery coating process, the controller 35 first controls the elevating unit 12 to raise the elevating pins 17a. After the elevating pins 17a are raised, a wafer W is loaded into the periphery coating unit U5. The wafer W is placed horizontally above the rotatable holding unit 11. A resist pattern is formed on the surface of the wafer W through a developing process in the developing unit U1, in advance. The transfer arm A5 lowers the wafer W and mounts the wafer W on the elevating pins 17a. Then, the transfer arm A5 is retreated out of the periphery coating unit U5. After the transfer arm A5 is completely retreated, the controller 35 controls the elevating unit 12 to move down elevating pins 17a, so that wafer W is mounted on the chuck 16. Then, by controlling the rotatable holding unit 11, the controller 35 allows the wafer W to be held on the chuck 16.

Figure 7:
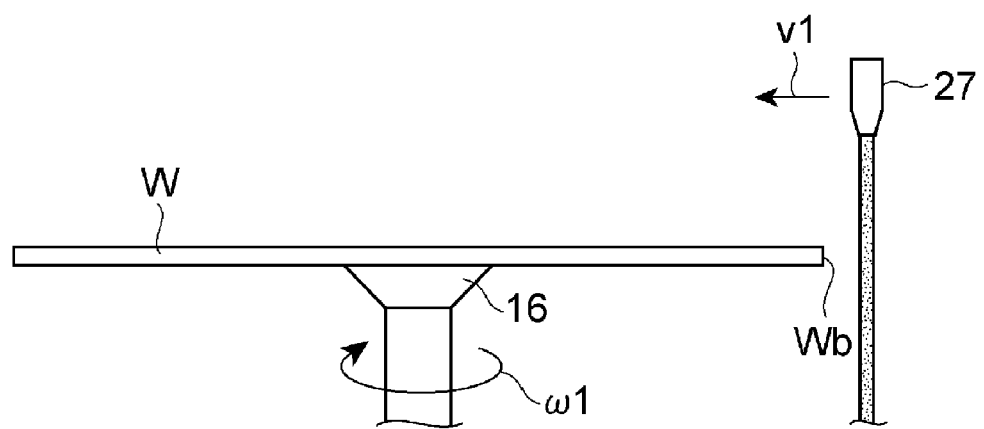
FIG. 7 is schematic diagram illustrating a state immediately before a scan-in process.
Figure 8:
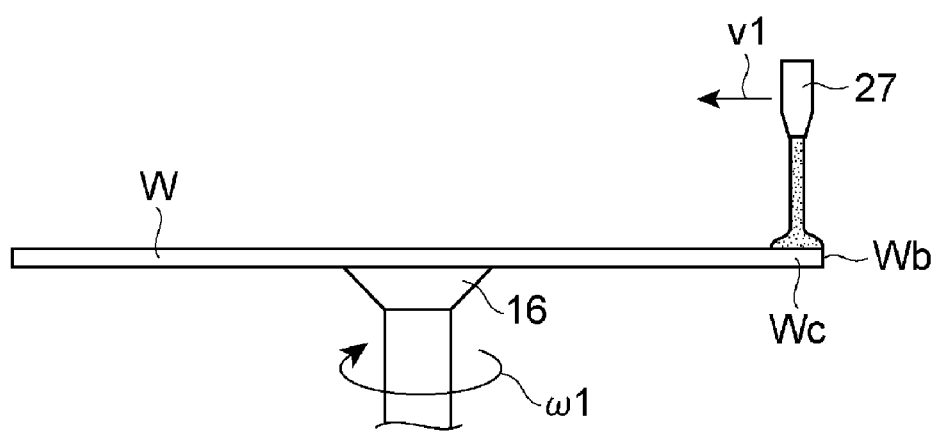
FIG. 8 is a schematic diagram illustrating a state during the scan-in process.
Figure 9:
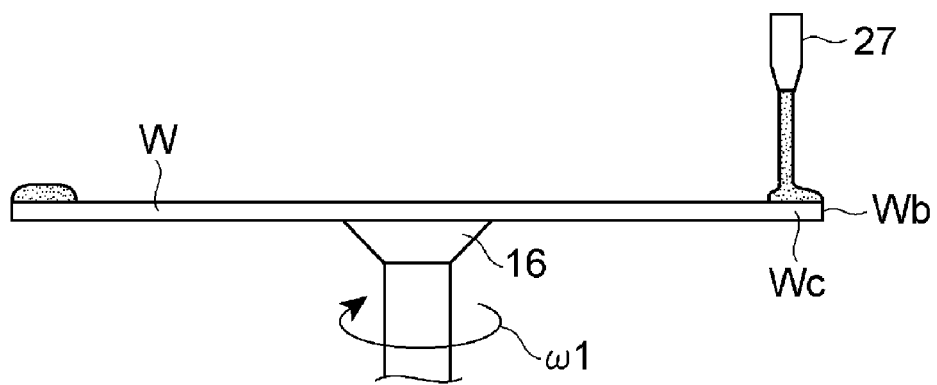
FIG. 9 is a schematic diagram illustrating a state immediately after the scan-in process.

Thereafter, the controller 35 performs a scan-in control (scan-in process), as illustrated in FIG. 7 to FIG. 9. That is, while rotating the wafer W at a rotational speed ω1 by controlling the rotatable holding unit 11, a resist liquid is discharged from the resist liquid nozzle 27 by controlling the resist liquid supply unit 13. In this state, by controlling the horizontal transfer unit 14, the resist liquid nozzle 27 is moved from the outside of an edge Wb of the wafer W to above a periphery region Wc of the wafer W at a speed v1. As the wafer W is rotated, the entire periphery region Wc of the wafer W is allowed to pass below the resist liquid nozzle 27.

Accordingly, the resist liquid is coated on the entire periphery region Wc, and an annular coating film is formed thereon. Here, desirably, the periphery region Wc may be in the range within, e.g., about 15 mm from the edge Wb of the wafer W; more desirably, within, e.g., about 10 mm; and, most desirably, within, e.g., about 5 mm.

Figure 10:
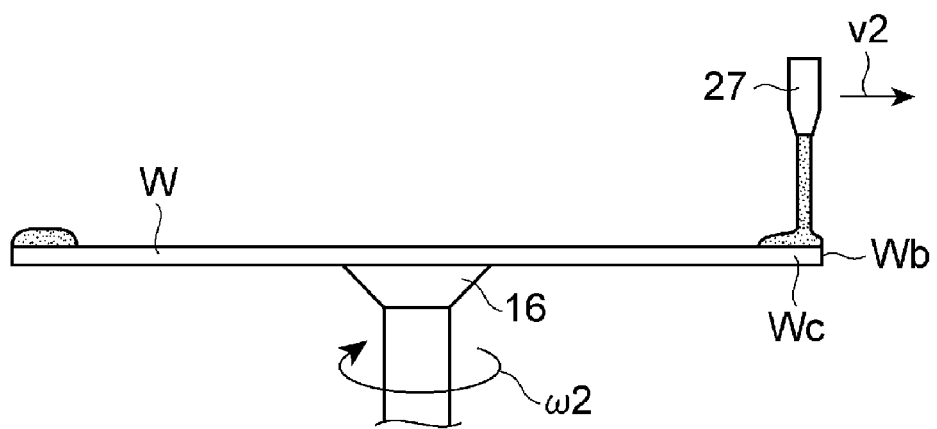
FIG. 10 is a schematic diagram illustrating a state during a scan-out process.
Figure 11:
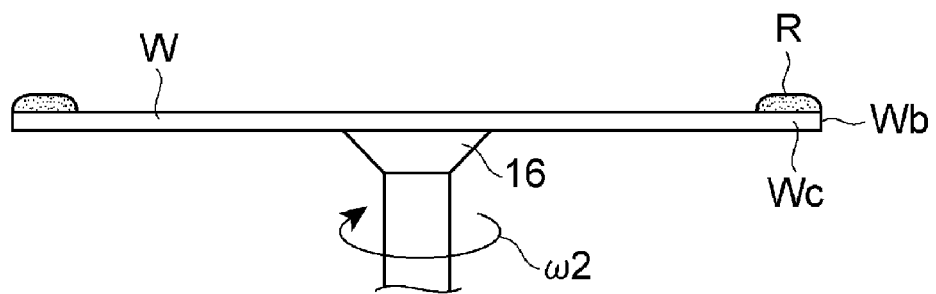
FIG. 11 is a schematic diagram illustrating a state immediately after the scan-out process.

Now, as illustrated in FIG. 10 and FIG. 11, the controller 35 performs a scan-out control (scan-out process). That is, while rotating the wafer W at a rotational speed ω2 by controlling the rotatable holding unit 11, the resist liquid is discharged from the resist liquid nozzle 27 by controlling the resist liquid supply unit 13. In this state, by controlling the horizontal transfer unit 14, the resist liquid nozzle 27 is moved from above the periphery region Wc of the wafer W to the outside of the edge Wb of the wafer W at a speed v2. Through this process, the coating of the resist liquid is completed. As a result, an annular periphery resist film R is formed only on the periphery region Wc of the wafer W efficiently.

Subsequently, by controlling the resist liquid supply unit 13, the discharge of the resist liquid is stopped. Then, by controlling the rotatable holding unit 11, the rotation of the wafer W is stopped, and the wafer W is released from the chuck 16. Then, by controlling the elevating unit 12, the elevating pins 17a are raised. Once the wafer W is raised along with the elevating pins 17a, the transfer arm A5 is moved to below the wafer W and then raised to receive the wafer W from the elevating pins 17a. Thereafter, the transfer arm A5 with the wafer W thereon is then unloaded from the periphery coating unit U5, and the periphery coating process is ended.

Figure 12A:
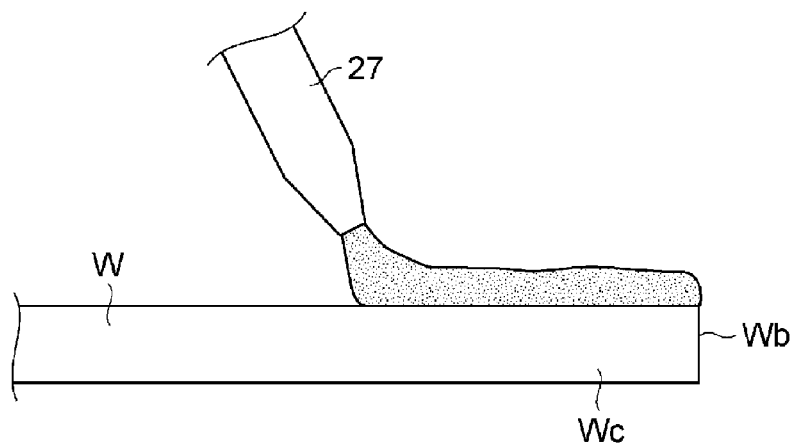
FIG. 12A to FIG. 12C are schematic diagrams illustrating a state of a resist film when a moving speed of the coating liquid nozzle is higher than a moving speed of a resist liquid.
Figure 12B:
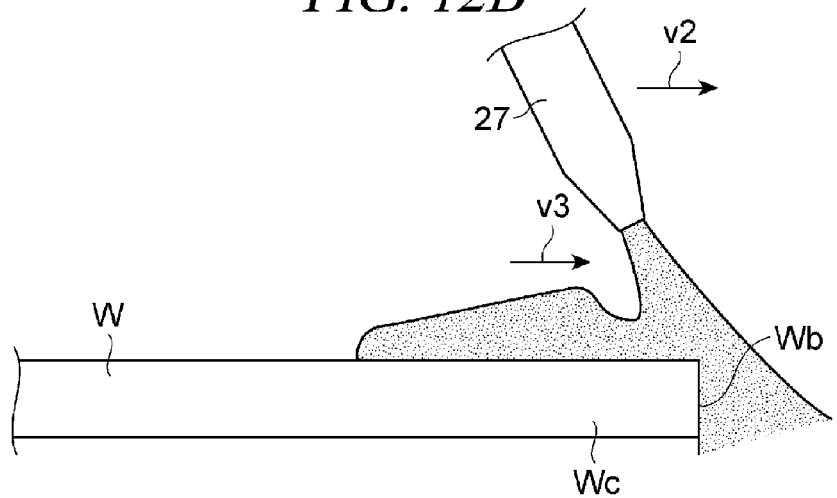
Figure 12C:
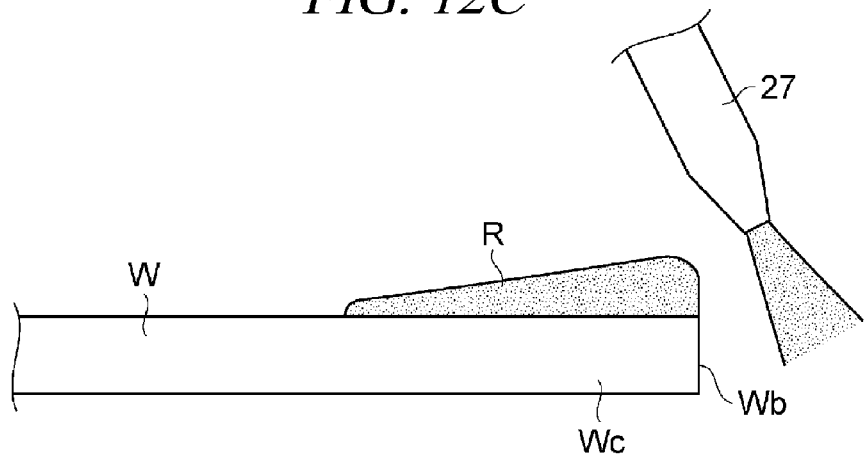
Figure 13A:
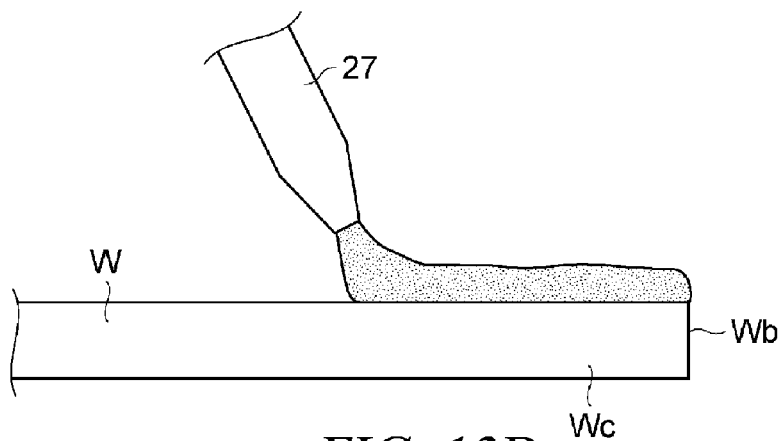
FIG. 13A to FIG. 13C are schematic diagrams illustrating a state of a resist film when a moving speed of the coating liquid nozzle is lower than a moving speed of a resist liquid.
Figure 13B:
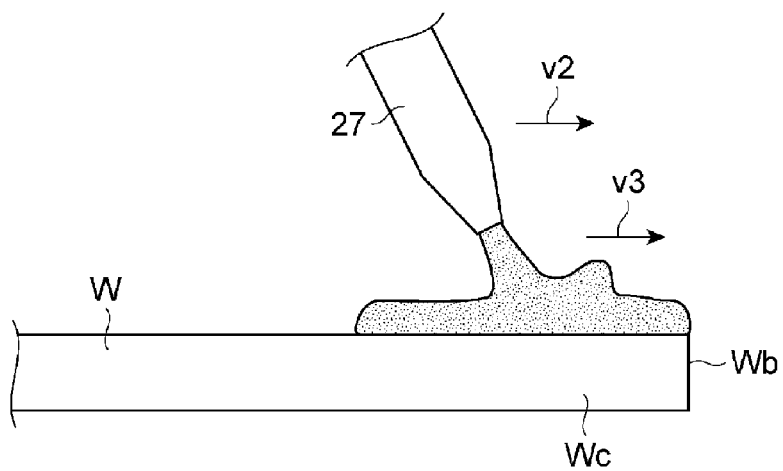
Figure 13C:
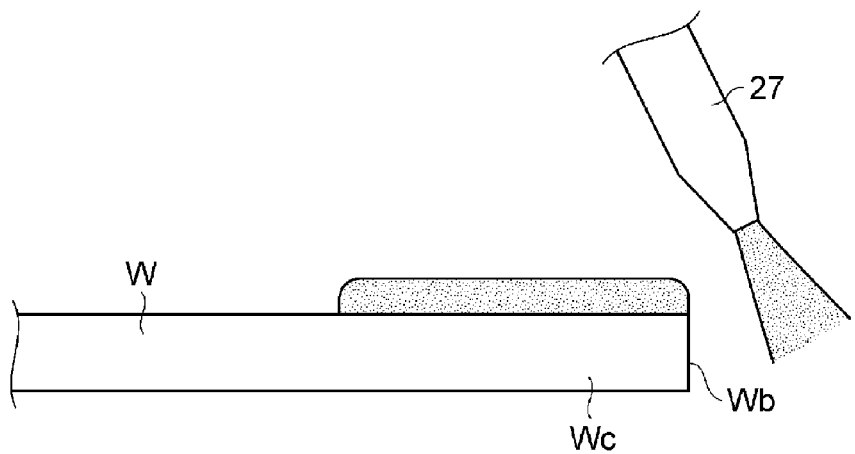

Here, the moving speed v2 of the resist nozzle 27 in the scan-out process will be elaborated. The moving speed v2 is lower than a speed at which the resist liquid on the periphery region Wc of the wafer W is moved toward the edge Wb of the wafer W. FIG. 12A to FIG. 12C are schematic diagrams illustrating a phenomenon generated when the moving speed of the resist liquid nozzle 27 is higher than the speed at which the resist liquid on the periphery region Wc of the wafer W is moved toward the edge Wb thereof. FIG. 13A to FIG. 13C are schematic diagrams illustrating a phenomenon generated when the moving speed of the resist liquid nozzle 27 is lower than the speed at which the resist liquid on the periphery region Wc of the wafer W is moved to the edge Wb thereof. FIG. 12A and FIG. 13A show the periphery region Wc of the wafer W at a time of starting the scan-out process. FIG. 12B and FIG. 13B show the periphery region Wc of the wafer W while the scan-out process is being performed. FIG. 12C and FIG. 13C illustrate the periphery region Wc of the wafer W at a time of finishing the scan-out process.

A surplus resist liquid coated at the time of FIG. 12A and FIG. 13A is moved toward the edge Wb of the wafer W at a speed v3 by a centrifugal force generated by the rotation of the wafer W. If the moving speed v2 of the resist liquid nozzle 27 is higher than the moving speed v3 of the surplus resist liquid, the resist liquid nozzle 27 may overtake the resist liquid, which is being moved toward the edge Wb of the wafer W, to move to the outside of the edge Wb, as illustrated in FIG. 12B and FIG. 12C. After the resist liquid nozzle 27 is moved to the outside of the edge Wb, the surplus resist liquid may be concentrated on the side of the edge Wb, so that the thickness of the periphery resist film R may become increased toward the edge Wb of the wafer W.

In contrast, if the moving speed v2 of the resist liquid nozzle 27 is lower than the moving speed v3 of the surplus resist liquid, the resist liquid nozzle 27 may be moved, following the resist liquid being moved toward the edge Wb of the wafer W, as illustrated in FIG. 13B and FIG. 13C. Accordingly, the surplus resist liquid may be pushed by the resist liquid discharged from the resist liquid nozzle 27 toward the outside of the edge Wb of the wafer W. Further, the resist liquid nozzle 27 is moved at a lower speed and thus allowed to stay above the periphery region Wc for a longer time. Accordingly, even when the surplus resist liquid starts to be hardened on the periphery region Wc of the wafer W, the surplus resist liquid starting to be hardened may be dissolved by the resist liquid discharged from the resist liquid nozzle 27 to be pushed toward the outside of the edge Wb of the wafer W. Accordingly, it is possible to suppress the surplus resist liquid from being concentrated on the side of the edge Wb of the wafer W. Thus, a resist film having a sufficiently uniform thickness can be formed.

Here, it may be difficult to actually measure the moving speed v3 of the resist liquid. Instead of actually measuring the moving speed v3, the value of the moving speed v2 that falls below the moving speed v3 may be estimated in the following way. A multiple number of wafers W are prepared, and a periphery coating process is performed on each wafer W. Whenever the wafers W are exchanged, the moving speed v2 of the resist liquid nozzle 27 in the scan-out process is gradually decreased. Then, as for a periphery resist film R formed on each wafer W, a film thickness on the side of the edge Wb of the wafer W and a film thickness on the side of a rotation center CL are respectively measured, and a difference therebetween is calculated. As a result, it can be found out that the thickness difference is rapidly decreased in a certain wafer where the moving speed v2 falls below a certain value. It may be expected that if the moving speed v2 is set to be equal to or lower than this certain value, the moving speed v2 may fall below the moving speed v3 of the resist liquid. By way of example, the present inventors have found out that the certain value is about 4 mm/s when a wafer having a diameter of, e.g., about 300 mm is rotated at a speed of about 1500 rpm and a general resist liquid is coated thereon.

Base on the above observation, the moving speed v2 may be set to be equal to or lower than, e.g., about 4 mm/s. The moving speed v3 may be varied depending on a centrifugal acceleration. If the moving speed v2 is defined as a ratio to the centrifugal acceleration, it may be possible to set an appropriate moving speed v2 for the centrifugal acceleration. When calculating the centrifugal acceleration as a radius of the wafer W multiplied by the square of a rotational speed per second, the certain value of about 4 mm/s may be calculated as a speed of about 0.004% of the centrifugal acceleration per second. Accordingly, the moving speed v2 per second may be set to be equal to or lower than about 0.004% of the value obtained by multiplying the radius of the wafer W by the square of the rotational speed per second. In these cases, the surplus resist liquid may be pushed away toward the outside of the edge Wb of the wafer W more securely. Further, by setting the moving speed v2 to be lower than the moving speed v1 of the resist liquid nozzle 27 in the scan-in process, the surplus resist liquid can also be moved toward the outside of the edge Wb of the wafer W more securely.

Further, the rotational speed ω2 of the wafer W in the scan-out process may be set to be higher than the rotational speed ω1 of the wafer W in the scan-in process. In this case, the moving speed of the resist liquid toward the edge Wb of the wafer W in the scan-out process can be increased. Thus, by setting the moving speed of the resist liquid nozzle 27 to be relatively lower than the moving speed of the resist liquid toward the edge Wb, the surplus resist liquid can be pushed to the outside of the edge Wb of the wafer W more securely.

As discussed above, in accordance with the periphery coating unit U5, the surplus resist liquid on the periphery region Wc of the wafer W can be pushed to the outside of the edge Wb, and a periphery resist film having a sufficiently uniform thickness can be formed. Further, as described above, the discharge direction DR of the resist liquid through the resist liquid nozzle 27 may be oriented toward the opposite side to the rotation center CL of the wafer W when viewed from a direction orthogonal to the vertical direction and also orthogonal to the moving direction of the resist liquid nozzle 27. With this configuration, the surplus resist liquid can be pushed to the outside of the edge Wb of the wafer W more securely.

Figure 14:
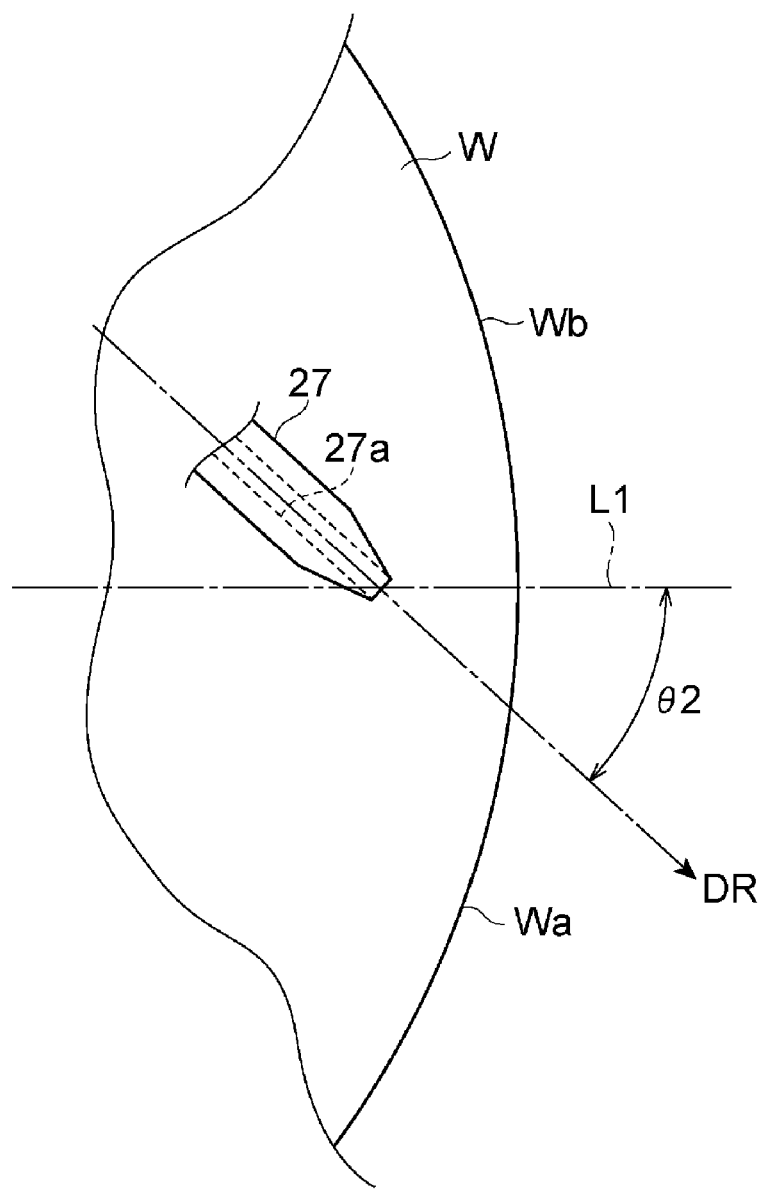
FIG. 14 is a plane view illustrating a modification example of the periphery coating unit.

As depicted in FIG. 14, the discharge direction DR of the resist liquid nozzle 27 may be inclined toward a moving direction of the periphery region Wc of the wafer W. FIG. 14 illustrates an example where the wafer W is rotated in a clockwise direction and the periphery region Wc is rotated in a downward direction of the drawing. In this case, the discharge direction DR is inclined to the downward direction of the drawing. Accordingly, the surplus resist liquid can be more securely pushed to the outside of the edge Wb of the wafer W. The inclination angle $\theta 2$ of the discharge direction DR with respect to the moving direction of the resist liquid nozzle 27, when viewed from the top, may be set to be in the range of, desirably, about 0° to about 90°; more desirably, about 0° to about 60°; and, most desirably, about 5° to about 45°.

When performing the scan-out process, the controller 35 may control the resist liquid supply unit 13 such that a discharging pressure of the resist liquid increases as the resist liquid nozzle 27 approaches the edge Wb of the wafer W. The surplus resist liquid tends to be concentrated on the side of the edge Wb due to the centrifugal force generated by the rotation of the wafer W. Thus, by increasing the discharging pressure of the resist liquid as the resist liquid nozzle 27 approaches the edge Wb, the surplus resist liquid can be further securely moved to the outside of the edge Wb of the wafer W.

Further, when performing the scan-out process, the controller 35 may control the horizontal transfer unit 14 such that the moving speed v2 of the resist liquid nozzle 27 decreases as the resist liquid nozzle 27 approaches the edge Wb of the wafer W. By decreasing the moving speed v2 of the resist liquid nozzle 27 as the resist liquid nozzle 27 approaches the edge Wb, the time during which the resist liquid nozzle 27 stays above the periphery region Wc of the wafer W can be lengthened. Accordingly, the surplus resist liquid can be moved to the outside of the edge Wb more securely.

Figure 15:
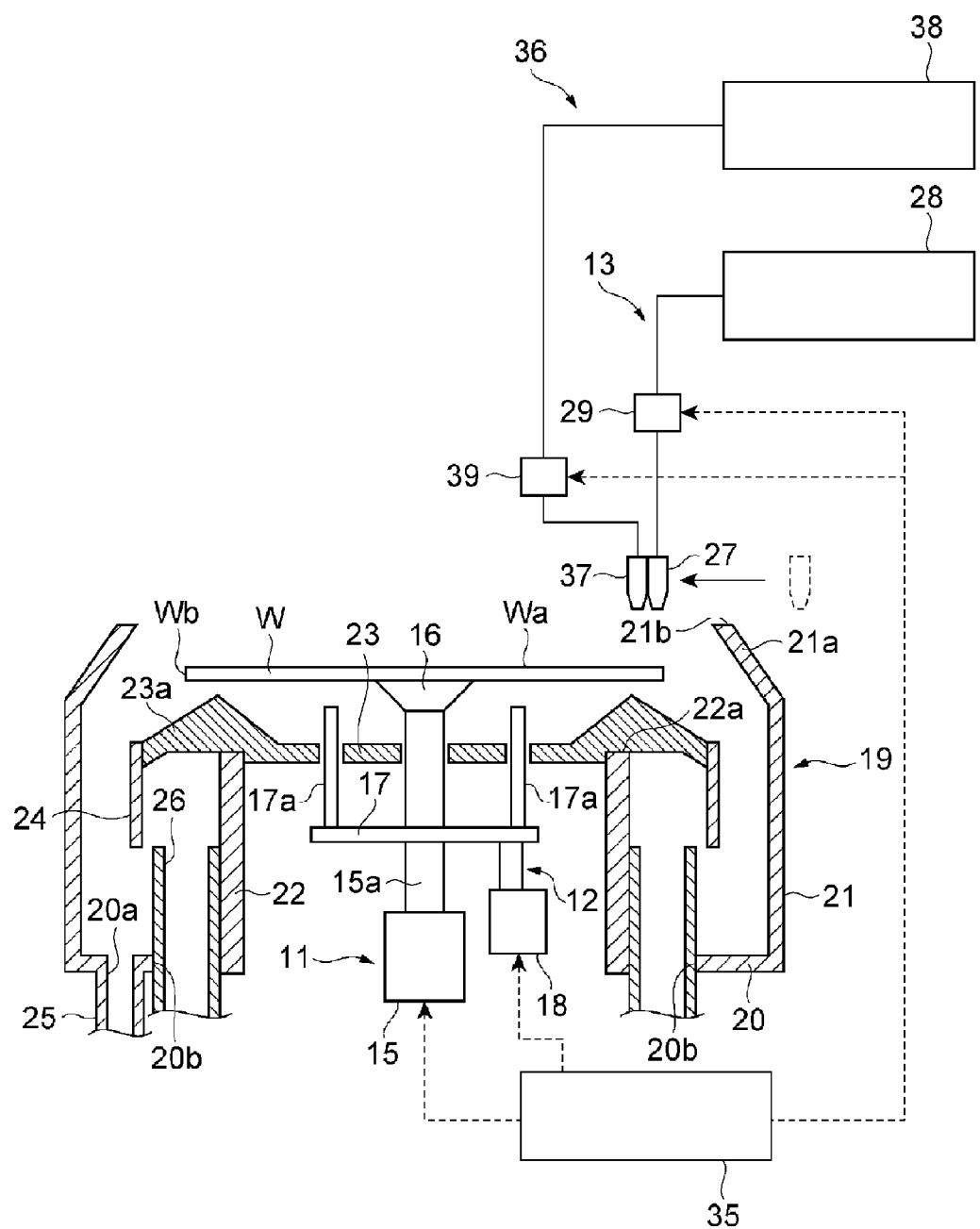
FIG. 15 is a cross sectional view illustrating another modification example of the periphery coating unit.

The periphery coating unit U5 may include a gas discharging unit 36 configured to discharge a gas onto the surface of the wafer W, as illustrated in FIG. 15. The gas discharging unit 36 may include a gas nozzle 37 configured to discharge the gas downward; and a gas supply source 38 configured to supply and push the gas to the gas nozzle 37. A valve 39 may be provided between the gas nozzle 37 and the gas supply source 38. The gas nozzle 37 is positioned closer to the rotation center CL of the wafer W as compared to the resist liquid nozzle 27. The horizontal transfer unit 14 horizontally moves the gas nozzle 37 together with the resist liquid nozzle 27. When performing the scan-out process, the controller 35 controls the gas discharging unit 36 to discharge a gas from the gas nozzle 37. In this case, the gas may be discharged to a portion of the wafer closer to the rotation center CL than a portion of the wafer where the resist liquid from the resist liquid nozzle 27 arrives. Thus, it may be possible to accelerate hardening of the portion of the wafer from which the surplus resist liquid is removed as the resist liquid nozzle 27 passes over. As a result, the uniformity of the film thickness obtained by the operation of the resist liquid nozzle 27 can be maintained more securely.

From the foregoing, it will be appreciated that various embodiments of the present disclosure have been described herein for purposes of illustration, and that various modifications may be made without departing from the scope and spirit of the present disclosure. By way of example, the coating liquid may not be limited to the resist liquid, and the example embodiments may also be applied to an apparatus that coats a coating liquid other than the resist liquid on a periphery region of a substrate. As one example, the example embodiments may also be applied to an apparatus that coats an adhesive on a periphery region of a substrate.

Below, an experimental example and a comparative example will be described. However, it should be noted that the example embodiments may not be limited thereto.

Experimental Example 1

As an experimental example 1, a periphery coating process is performed on a range within about 3 mm from an edge Wb of a wafer W having a diameter of about 300 mm. In a scan-in process, a rotational speed $\omega 1$ of the wafer W is set to about 250 rpm, and a moving speed v1 of the resist liquid nozzle 27 is set to about 10 mm/s. In a scan-out process, a rotational speed $\omega 2$ of the wafer W is set to about 1500 rpm, and a moving speed v2 of the resist liquid nozzle 27 is set to about 1 mm/s.

Comparative Example 2

As a comparative example 1, a periphery coating process is performed on a range within about 3 mm from an edge Wb of a wafer W having a diameter of about 300 mm. In a scan-in process, a rotational speed $\omega 1$ of the wafer W is set to about 250 rpm, and a moving speed v1 of the resist liquid nozzle 27 is set to about 10 mm/s. In a scan-out process, a rotational speed $\omega 2$ of the wafer W is set to about 1500 rpm, and a moving speed v2 of the resist liquid nozzle 27 is set to about 10 mm/s.

Evaluation of Film Thickness

Figure 16:
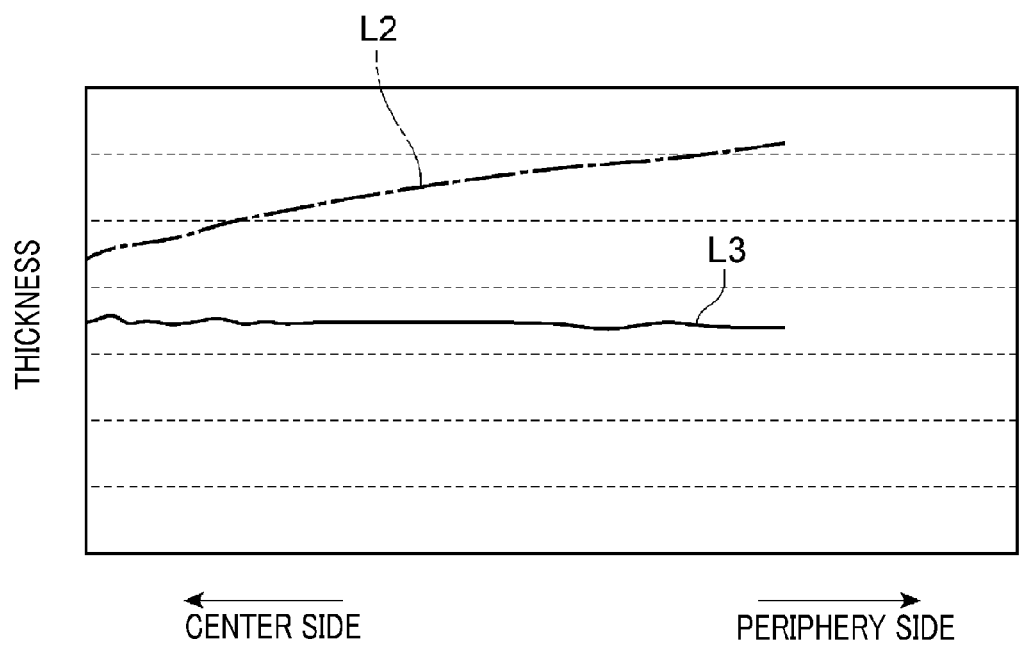
FIG. 16 is a graph showing a measurement result of a film thickness.

For each of the wafers W on which the periphery coating process is performed in the experimental example 1 and the comparative example 1, the film thicknesses of a periphery resist film R at positions ranging from about 146 mm to about 149 mm from a rotation center CL of the wafer W are measured. The measurement results are provided in FIG. 16. As indicated by a line L2 of FIG. 16, as for the wafer W on which the periphery coating process is performed in the comparative example 1, the film thickness is found to become increased from the rotation center CL of the wafer W toward the edge Wb thereof, and a film thickness difference between on the side of the rotation center CL and on the side of the edge Wb is found to reach about 36% of an average film thickness. In contrast, when the wafer W on which the periphery coating process is performed in the experimental example 1, the film thickness of the periphery resist film R is found to be substantially uniform, as indicated by a line L3 of FIG. 16. From this result, it is found out that a coating film having a sufficiently uniform thickness can be formed in accordance with the example embodiments.

We claim:

1. A periphery coating method of coating a coating liquid on a periphery region of a substrate, the method comprising:
  performing a scan-in process of moving the coating liquid nozzle from an outside of an edge of the substrate to a position above the periphery region of the substrate while rotating the substrate and discharging the coating liquid from the coating liquid nozzle; and performing a scan-out process of moving the coating liquid nozzle from the position above the periphery region of the substrate to the outside of the edge of the substrate while rotating the substrate and discharging the coating liquid from the coating liquid nozzle, wherein, in the scan-out process, the coating liquid nozzle is moved at a speed lower than a speed at which the coating liquid is moved to a side of an edge of the substrate.

2. The periphery coating method of claim 1, wherein, in the scan-out process, the coating liquid nozzle is moved at a speed lower than a speed at which the coating liquid nozzle is moved in the scan-in process.

3. A computer-readable storage medium having stored thereon computer-executable instructions that, in response to execution, cause a periphery coating apparatus to perform a periphery coating method as claimed in claim 1.

\* \* \* \* \*

UNITED STATES PATENT AND TRADEMARK OFFICE
CERTIFICATE OF CORRECTION

PATENT NO. : 9,082,614 B1  
APPLICATION NO. : 14/682268  
DATED : July 14, 2015  
INVENTOR(S) : Shinichi Hatakeyama It is certified that error appears in the above-identified patent and that said Letters Patent is hereby corrected as shown below:

In the specification,

Column 10, line 12, please replace "We" with -- Wc --

Column 13, line 46, please replace "We" with -- Wc --

Signed and Sealed this
Twelfth Day of January, 2016

Michelle K. Lee
*Director of the United States Patent and Trademark Office*